(12) United States Patent
Chamarti et al.

(10) Patent No.: US 8,754,634 B2
(45) Date of Patent: Jun. 17, 2014

(54) SYSTEM AND METHOD FOR TAMPER DETECTION IN A UTILITY METER

(75) Inventors: Subramanyam Satyasurya Chamarti, Johns Creek, GA (US); Bruce Joni Tomson, Marietta, GA (US); Michael George Glazebrook, Marietta, GA (US); Rathindra Nahar, Suwanee, GA (US)

(73) Assignee: General Electric Company, Schenectady, NY (US)

( * ) Notice: Subject to any disclaimer, the term of this patent is extended or adjusted under 35 U.S.C. 154(b) by 184 days.

(21) Appl. No.: 13/296,188

(22) Filed: Nov. 14, 2011

(65) Prior Publication Data

US 2013/0119974 A1    May 16, 2013

(51) Int. Cl.
*G01R 1/00* (2006.01)
(52) U.S. Cl.
USPC ........... 324/110; 324/142; 324/156; 340/541; 200/61.93
(58) Field of Classification Search
USPC .................. 324/110, 114, 142, 156; 340/540, 340/870.02, 545.6, 541; 200/61.93
See application file for complete search history.

(56) References Cited

U.S. PATENT DOCUMENTS

| | | | |
|---|---|---|---|
| 4,565,995 A * | 1/1986 | Stokes et al. .................. 340/571 |
| 5,092,469 A | 3/1992 | Takata et al. |
| 5,610,340 A | 3/1997 | Carr et al. |
| 5,780,711 A | 7/1998 | Glazebrook |
| 6,774,807 B1 * | 8/2004 | Lehfeldt et al. ............. 340/686.1 |
| 6,885,185 B1 * | 4/2005 | Makinson et al. ............ 324/142 |
| 7,189,109 B2 * | 3/2007 | Robinson ...................... 439/517 |
| 7,336,194 B2 * | 2/2008 | Hillman et al. ............ 340/686.1 |
| 7,495,555 B2 * | 2/2009 | Seal et al. ..................... 340/551 |
| 7,528,717 B2 * | 5/2009 | Benjelloun et al. ......... 340/568.1 |
| 7,583,202 B2 * | 9/2009 | Robinson et al. ......... 340/870.02 |
| 7,745,749 B2 * | 6/2010 | Ito .................................. 200/336 |
| 7,825,801 B2 * | 11/2010 | Woods .......................... 340/547 |
| 2009/0243866 A1 | 10/2009 | Murphy |
| 2012/0074927 A1 * | 3/2012 | Ramirez ....................... 324/110 |

* cited by examiner

*Primary Examiner* — Huy Q Phan
*Assistant Examiner* — James Split
(74) *Attorney, Agent, or Firm* — Fletcher Yoder, P.C.

(57) ABSTRACT

Systems and methods for detecting the removal of a meter cover are provided. For example, a tamper-detect energy meter may include metering circuitry, a processor, a tamper detect switch, and a cover with a switch interface surface. The tamper detect switch may be triggered from an open circuit state to a closed circuit state as the switch interface surface of the cover contacts the tamper detect switch during removal.

20 Claims, 6 Drawing Sheets

SYSTEM AND METHOD FOR TAMPER DETECTION IN A UTILITY METER

BACKGROUND OF THE INVENTION

The subject matter disclosed herein relates to tamper detection in a utility meter.

Utility meters incorporate many functionalities relating to the consumption of a utility such as water, electricity, and gas, to name a few. For example, utility meters may enable a utility provider, such as an electricity provider, to remotely monitor a consumer's use of the utility. In this way, the utility provider may rarely, if ever, physically access the utility meter. However, in certain circumstances, such as when the utility meter malfunctions, the utility provider, the consumer, or a technician may be required to physically access the meter. For example, a technician employed by the utility provider may open the utility meter, such as by removing the cover of the meter, to perform maintenance on the meter. Therefore, the utility meter may include certain functionalities that are accessible to an authorized user to make adjustments to one or more operational parameters of the meter. Unfortunately, in certain situations, an unauthorized person may attempt to access these functionalities, for example in an attempt to restore electricity to a residence that has not paid for the electricity. Accordingly, certain utility meters may be opened, such as by removal of the meter's cover, and subject to tampering or another unauthorized use.

BRIEF DESCRIPTION OF THE INVENTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a utility meter includes metering circuitry configured to monitor consumption of a utility, and a meter cover disposed over at least a portion of the metering circuitry. The meter cover has a switch interface surface. The utility meter also includes a switch configured to contact the switch interface surface during removal of the meter cover from the utility meter to cause the switch to change from an open circuit state to a closed circuit state. When the switch changes from the open circuit state to the closed circuit state, the utility meter is configured to generate a signal indicative of the meter cover removal.

In another embodiment, a retrofit kit for a utility meter is provided. The kit includes a switch configured to move between an open circuit state and a closed circuit state, wherein the switch is configured to trigger a signal indicative of a tamper event in the closed circuit state. The kit also includes a meter cover configured to cover at least a portion of the utility meter, wherein the meter cover includes a switch interface surface configured to contact the switch during removal of the meter cover from the utility meter to change the switch from the open circuit state to the closed circuit state.

In a further embodiment, a method includes monitoring energy consumption of a utility with metering circuitry of the utility meter, controlling an operational parameter of the metering circuitry using a processor of the utility meter, and providing an electrical pulse to the processor during removal of a meter cover of the utility meter using a switch communicatively coupled to the processor, wherein the electrical pulse is indicative of the removal of the meter cover.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

Figure 1:
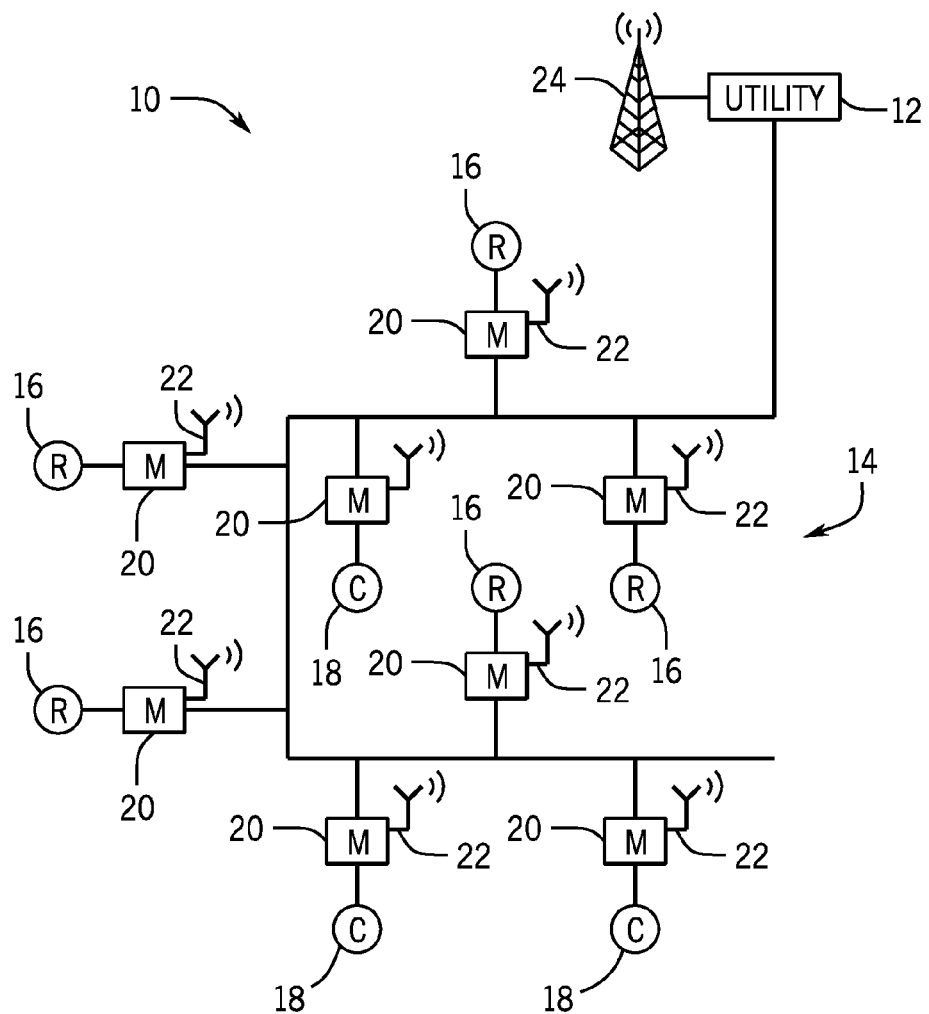
FIG. 1 is a block diagram of an embodiment of an electrical system in which tamper-detect energy meters may monitor power consumption by various loads.

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

As noted above, certain utility meters may be subject to tampering by removing a cover of the utility meter and accessing certain control elements of the meter. For example, an unauthorized user may remove the cover of an energy meter and attempt to restore electricity or change a reading of the meter by manipulating certain control features of the meter. Accordingly, the disclosed embodiments relate to utility meters capable of detecting the removal of a cover of the utility meter to detect a potential tamper situation. Such detection may be performed as the utility meter is in a normal operational state (i.e., the utility is being supplied to a consumer), or in a base operational state (e.g., low power or no utility being provided to the consumer).

The detection may be performed by a switch on the utility meter, such as a push button or tact switch, which is in an "off" state (i.e., an open circuit state) while the meter cover is suitably positioned on the utility meter. The meter cover may include a switch interface surface, such as a ramped or tapered surface, that contacts the switch as the meter cover is removed from the utility meter. Therefore, as the switch is contacted by the switch interface surface, the switch changes from the "off" state to an "on" state (i.e., a closed circuit state). When in the "on" state, the switch may cause a signal to be provided to a processor of the meter to indicate a potential tampering situation. Indeed, as defined herein, the open circuit or "off" state is intended to denote a state in which current does not flow via the switch, and the closed circuit or "on" state is intended to denote a state in which a current flow is enabled via the switch. Therefore, in the present context, the signal is unable to reach the processor when the switch is in the open circuit or "off" state, and the signal is able to reach the processor when the switch is in the closed circuit or "on" state. As a result of receiving this signal, the processor may record the potential tampering event locally (e.g., in nonvolatile memory) and, in certain embodiments, may remotely notify a utility provider of the situation to enable the utility provider to take an appropriate action.

It should be noted that while the disclosed embodiments are discussed in the context of energy meters capable of detecting potential tamper situations, that other types of utilities are also presently contemplated. For example, meters in accordance with the disclosed embodiments may monitor any one or a combination of electricity, heat, gas, water, or any other utility. Therefore, while the disclosed embodiments are presented in the context of tamper-detect energy meters, other tamper-detect utility meters, such as tamper-detect heat meters, tamper-detect gas meters, tamper-detect water meters, or any combination thereof, are presently contemplated. Furthermore, energy meters, as presently discussed, may include gas meters, electricity meters, or a combination thereof.

With the foregoing in mind, FIG. 1 represents a block diagram of an electrical system 10, which includes a power utility 12, which supplies power to a power grid 14. Loads on the power grid may include, for example, residential establishments 16 and commercial establishments 18. Tamper-detect energy meters 20 may monitor the power consumption by the residential establishments 16 or commercial establishments 18. As mentioned above and described in greater detail below, the tamper-detect energy meters 20 are generally configured to detect the removal of their respective meter covers to enable identification of potential tampering situations.

In a normal operational state, the tamper-detect energy meters 20 may monitor power consumed by the residential establishment 16 or the commercial establishment 18 to which they are affixed. Additionally, the tamper-detect energy meters 20 may communicate with the power utility 12 via data communication links 22. Such data communication links 22 may be wired (e.g., over wired telecommunication infrastructure) or wireless (e.g., a cellular network or other wireless broadband, such as WiMax). Similarly, the power utility 12 may employ a communication link 24 to communicate with the various tamper-detect energy meters 20. The communication link 24 may be wired or wireless, as may suitable to communicate to the various communication links 22 of the tamper-detect energy meters 20. For example, the tamper-detect energy meters 20 may communicate data indicative of potential tampering situations over the communication links 22.

The tamper-detect energy meters 20 may also be capable of detecting potential tampering situations even in low power situations, such as when electricity is not being provided to one or more of the establishments 16, 18 due to non-payment or a natural occurrence such as weather or seismic activity. For example, in accordance with certain embodiments, the tamper-detect energy meters 20 may utilize battery power (i.e., electrical energy from an energy storage unit) to maintain a base operational state (i.e., a sleep mode) in a low- or no-power situation. If the removal of a cover of the meter 20 is detected, the meter 20 may momentarily wake to record and/or communicate the potential tamper event, and may subsequently return to the base operational state until external power is restored to the meter 20.

The tamper-detect energy meters 20 may take a variety of forms. One embodiment of a three-phase tamper-detect energy meter 20 appears in FIG. 2 as joined to the power grid 14, as power flows from AC lines 26 to an AC load 16, 18 (e.g., a residential establishment 16 or a commercial establishment 18). Although the embodiment of FIG. 2 involves monitoring three-phase power, alternative embodiments of the tamper-detect energy meter 20 may monitor single-phase power. In the illustrated embodiment, the AC lines 26 may transmit three-phase power via three phase lines 28 and a neutral line 30. The tamper-detect energy meter 20 may obtain power via power supply circuitry 32 that may couple to the three phase lines 28 and the neutral line 30 for its internal power consumption. To backup power consumption data in the event of a power outage, the power supply circuitry 32 may also charge a battery and/or super capacitor 34 (i.e., an energy storage unit). In alternative embodiments, the backup power may be fed by a non-rechargeable battery. The battery/super capacitor 34 may also enable tamper detection in low- or no-power situations by providing electrical energy to various elements of the meter 20, as discussed in detail below.

Metering circuitry 36 may ascertain power consumption by monitoring the voltage and current traversing the AC lines 26 to the AC load 16, 18. In particular, voltage sensing circuitry 38 may determine the voltage based on the three phase lines 28 and the neutral line 30. Current transformers (CTs) 40 and current sensing circuitry 42 may determine the current flowing through the three phase lines 28. The metering circuitry 36 may output the current power consumption values to an electronic display 44, such as a liquid crystal display (LCD), as well as to a processor 46. The metering circuitry 36 may sense the voltage and current inputs and send corresponding pulses to the processor 46, which calculates the energy accumulation, power factor, active power, reactive power and maximum demand, etc. The processor 46 may store the demand details in memory 48 and/or nonvolatile storage 50, which may be NVRAM (EEPROM). The processor 46 may also store information relating to events in which a possible tamper situation has occurred. For example, a time and/or date in which a cover (FIG. 3) of the meter 20 has been removed may be recorded. As discussed below, information pertaining to the potential tamper event may be transmitted to a utility provider. The information may include, by way of non-limiting examples, a time of the tamper event, identification data of the meter, an identifier of the customer, GPS data, or any combination thereof.

The processor 46 may include one or more microprocessors, such as one or more "general-purpose" microprocessors, one or more application-specific processors (ASICs), a field programmable array (FPA) or a combination of such processing components, which may control the general operation of the tamper-detect energy meter 20. For example, the processor 46 may include one or more instruction set processors (e.g., RISC) and/or other related chipsets. Memory 48 and nonvolatile storage 50 may store the current and/or certain historical power consumption values, as well as provide instructions to enable the processor 46 to recognize potential tampering situations and take certain actions based on the recognition.

Programs or instructions executed by the processor 46 to recognize or detect potential tampering situations may be stored in any suitable manufacture that includes one or more non-transitory, tangible, computer-readable media at least collectively storing the executed instructions or routines, such as, but not limited to, the memory devices and storage devices described below. Also, these programs encoded on such a computer program product may also include instructions that may be executed by processor 46 to enable the tamper-detect energy meter 20 to provide various functionalities, such as communication with the utility provider 12 and a visual indication of a potential tampering situation on the display 44.

For example, instructions or data to be processed by the processor 46 may be stored in the memory 48, which may include a volatile memory, such as random access memory (RAM); a non-volatile memory, such as read-only memory (ROM); or a combination of RAM and ROM devices, or may be stored internal to the processor 46 and/or metering circuitry 36. The memory 48 may store firmware for the tamper-detect energy meter 20, such as a basic input/output system (BIOS), an operating system, various programs, applications, or any other routines that may be executed on the tamper-detect energy meter 20, including user interface functions, processor functions, communication functions, image acquisition functions, audio alteration functions, media playback functions, and so forth. The memory 48 may be optional if the processor 46 is capable of storing such information and/or firmware in its internal memory. For example, in embodiments where the meter 20 is not being powered by an external power source and is operating only on battery power, the processor 46 may wake from a sleep mode to store information relating to removal of the cover, such as the time and/or date of the removal, in its internal memory to conserve energy. The processor 46 may then power down back to a sleep mode until the meter 20 is powered back on. After power has been restored, the processor 46 may wake and write the time and/or date of the cover removal to the nonvolatile storage 50. As noted above, information pertaining to the event, the meter, the customer, or any combination thereof, may also be provided to the utility provider.

Therefore, the nonvolatile storage 50 may be utilized for persistent storage of data and/or instructions relating to tamper detection. The nonvolatile storage 50 may include flash memory, a hard drive, or any other optical, magnetic, and/or solid-state storage media. By way of non-limiting examples, the nonvolatile storage 50 may be used to store data files, such as historical power consumption as determined by the metering circuitry 36, as well as indications of consumer account balance information, dynamic power prices, tampering events, and/or abnormal activity on the power grid 14 as communicated to the tamper-detect energy meter 20 by the power utility 12. For example, in certain embodiments, the nonvolatile storage 50 may store dates and times relating to removal of a cover from the meter 20.

In the illustrated embodiment, the meter 20 includes a tamper detect switch 52 communicatively coupled with the battery/super capacitor 34 and the processor 46. The tamper detect switch 52 may be any switch capable of remaining in an "off" state (i.e., an open circuit state) until acted upon by an external stimulus to change to an "on" state (i.e., a closed circuit state). As a non-limiting example, the tamper detect switch 52 may be a tactile (tact) switch, a snap switch, a push button, a toggle switch, a dial, an optical switch, a magnetic switch, or any similar switch or button configured to change from the "off" state to the "on" state as a result of an applied force, such as a depressive force resulting from a button press. In other embodiments, usually "on" switches may alternatively be used. For example, in one embodiment, the switch 52 may have a clicking mechanism that enables the switch 52 to change states after successive depressions. For example, a first depression may change the switch 52 to the closed circuit state, where the switch 52 remains during normal operation of the meter 20. As the cover 70 is removed, the switch 52 may be depressed a second time, causing the switch 52 to change to an "off" or open circuit state, resulting in a concomitant signaling to the processor 46 of a potential tampering situation.

The tamper detect switch 52 may, in certain embodiments, be integrated into a main meter assembly (MMA) circuit board 53 that supports the processor 46, the display 44, and other elements of the meter 20. For example, the MMA circuit board 53 may also support the metering circuitry 36, NV storage 50, memory 48, one or more communication devices 54, various peripheral devices 56, or any combination thereof. In embodiments where the tamper-detect energy meter 20 is in the normally open circuit state, the tamper detect switch 52 may draw a minimal amount of current from the battery/super capacitor 34 until the switch 52 is changed from the "off" state to the "on" state. When changed to the "on" state, the tamper detect switch 52 draw a greater current, such as a current that is between approximately 2 and 100 times greater, between approximately 3 and 75 times greater, between approximately 4 and 50 times greater, or between approximately 5 and 30 times greater than the current draw in the open circuit or "off" state. In one non-limiting example, the switch 52 may draw between approximately 2 and 5 microamps (µA) in the "off" state and between approximately 100 and 150 µA in the "on" state. The nature of the current provided to the processor 46 is discussed in further detail below with respect to FIG. 6.

In an embodiment, when in the closed circuit or "on" state, the switch 52 may enable this higher current from the battery/super capacitor 34 to be provided to the processor 46. The processor 46 may be configured to recognize that the particular current provided via the switch 52 indicates a potential tamper situation. As a result of receiving such indications, the processor 46 may record a time and/or date of the potential tamper event (e.g., the cover removal) and may, in certain embodiments, communicate information relating to the event to the utility provider 12.

It should be noted that while the disclosed embodiments are presented in the context of enabling current to flow from the battery/super capacitor 34 to the processor 46, any configuration in which the tamper detect switch 52 changes from an open circuit state to a closed circuit state to enable a signal to be sent to the processor 46 to indicate a potential tampering situation is presently contemplated. Therefore, the signal provided to the processor 46 and initiated by the tamper detect switch 52 may be from any source, such as a standalone battery or capacitor that is not charged by power supply 32, directly from the power supply 32, from a dedicated power supply line for enabling operation of the meter 20 during weather or seismic events, indirectly from a memory unit (e.g., NV storage 50), or any combination thereof.

As mentioned above, the tamper-detect energy meter 20 may communicate with the power utility 12 to obtain indications of consumer account balance information, dynamic power prices, abnormal activity on the power grid 14, and to provide indications relating to potential tampering situations (e.g., meter cover removal). Such communication may take place via the one or more communication devices 54, which may include interfaces for a personal area network (PAN), such as a Bluetooth network, a local area network (LAN), such as an 802.11x Wi-Fi network, a wide area network (WAN), such as a 3G or 4G cellular network (e.g., WiMax), an infrared (IR) communication link, a Universal Serial Bus (USB) port, and/or a power line data transmission network such as Power Line Communication (PLC) or Power Line Carrier Communication (PLCC). Additionally, the tamper-detect energy meter 20 may connect to the various peripheral devices 56, such as computing devices (e.g., computers or portable phones) or input devices (e.g., a keyboard).

In certain embodiments, the power utility 12 may communicate with the tamper-detect energy meter 20 to remotely control the flow of power to the AC load 16, 18. Based on instructions from the power utility 12 via the communication device(s) 54, the processor 46 may correspondingly instruct relay control circuitry 58 to open or close a relay 60. For example, if the consumer has not paid for the power being received, the relay 60 may be opened, disconnecting the AC load 16, 18 from the AC lines 26. Once the consumer has paid for further electrical power, the power utility 12 may instruct the tamper-detect energy meter 20 to close the relay 60, reconnecting power to the AC load 16, 18.

Figure 3:
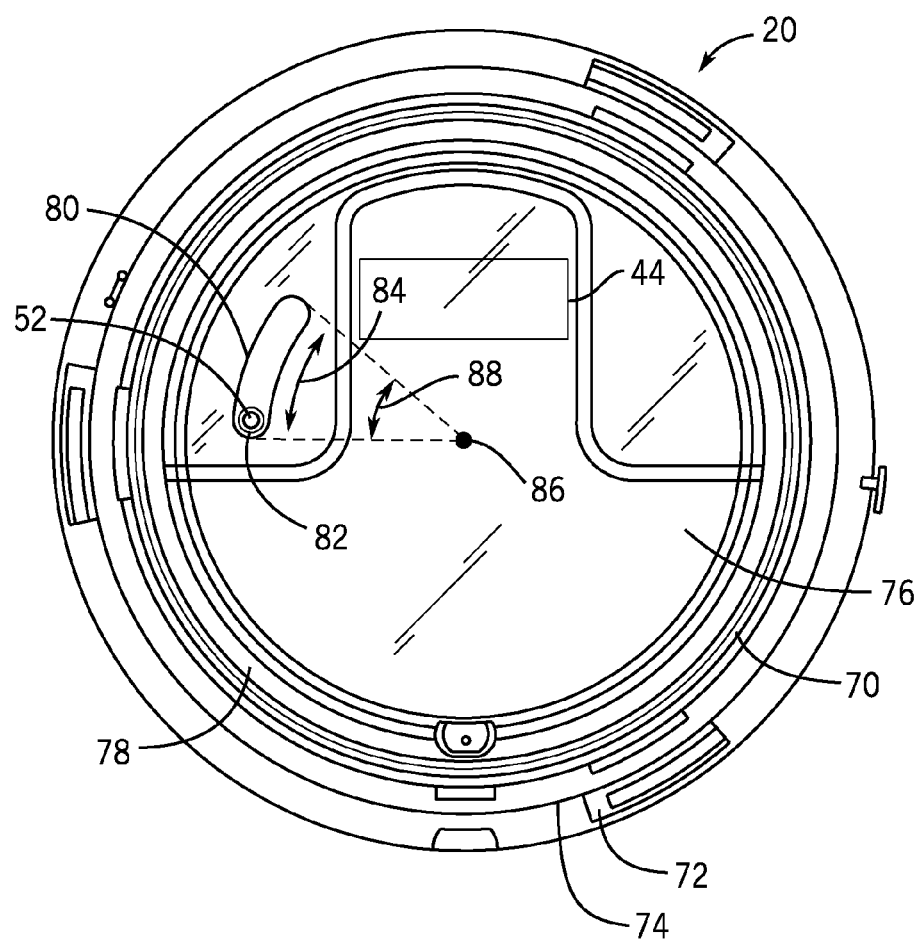
FIG. 3 is a front-view illustration of an embodiment of the tamper-detect energy meter of FIG. 2 having a push button switch and a cover configured to change the state of the switch as the cover is rotated.

As note above, the tamper detect switch 52 may assume a variety of forms, and may remain in an "off" or open circuit state until a potential tampering situation is detected. One embodiment of the manner in which the tamper-detect energy meter 20 is configured for such detection is illustrated in FIG. 3. FIG. 3 is a front view illustration of an embodiment of the meter 20 and illustrating the tamper-detect energy meter 20 as including an annular-shaped cover 70 positioned over a base portion 72 of the meter 20. It should be noted that the front of the cover 70 is illustrated as substantially transparent to facilitate the discussion of various components of the meter 20. Further, as discussed below, the use of other cover cross-sectional geometries, such as square, rectangular, triangular, semi-circular, elliptical, polygonal or any such geometry, is presently contemplated. The annular-shaped cover 70 includes a coupling region 74, which is configured to couple the cover 70 with the base portion 72. While any coupling mechanism is presently contemplated, by way of non-limiting examples, the coupling region 74 may couple the cover 70 with the base portion 72 via threads, teeth, an interference fit, friction fit, snap fit, or any combination thereof. In one embodiment, the cover 70 couples to the base portion 72 via a rotatable coupling using threads and an interference or friction fit, such that the meter 20 supplies resistance to removal of the cover 70. Providing such resistance may be desirable to control the timing in which a person may remove the cover 70 from the base portion 72.

As illustrated, the cover 70 is disposed over a faceplate 76 of the meter 20. Specifically, the cover 70 includes a front section 78 that is placed in a substantially parallel relationship with the faceplate 76 as the cover 70 is secured to the base 72. The faceplate 76 may protect and cover various elements of the meter 20 that are mounted to the MMA circuit board 53. Thus, the faceplate 76, when the meter 20 is fully assembled, may be disposed between the MMA circuit board 53 and the front section 78 of the cover 70. At least a portion of the front section 78 may be at least partially transparent so as to enable a user (e.g., a power consumer or technician) to view the display 44, while other portions may be opaque, for example to hide certain control or tamper detect features of the meter 20.

In the illustrated embodiment, the front section 78 includes a switch interface surface 80. The switch interface surface 80 is generally configured to contact the tamper detect switch 52 during removal of the cover 70 from the base portion 72 of the meter 20. Specifically, as illustrated, the switch 52 protrudes from the MMA circuit board 53 and through the faceplate 76. The switch 52, as discussed in further detail below, includes a contact surface 82 that, as the cover 70 is removed (e.g., rotatably removed) from the base portion 72, abuts the switch interface surface 80 of the cover 70, such that surface 80 provides sufficient depressive force to change the state of the switch 52 from the open circuit state to the closed circuit state. Again, when in the closed circuit state, an electrical signal may be provided to the processor 46 (FIG. 2), indicating a potential tamper situation. Further, while the illustrated embodiment depicts only one tamper detect switch 52, it should be noted that the meters in accordance with the disclosed embodiments may, in certain embodiments, include more than one tamper detect switch. For example, it may be desirable to place two, three, four, or more tamper detect switches along a path of rotation or other removal path to enable the processor 46 to determine, for example, a degree to which the cover 70 has been rotated to differentiate actual cover removal versus partial cover rotation.

Because the cover 70 is rotatably coupled to the base portion 72 in the illustrated embodiment, the cover 70 may be rotated in a clockwise or counterclockwise direction, illustrated as double-headed arrow 84, to remove the cover 70. Indeed, the switch interface surface 80 may have an arcuate shape that generally defines the region of the cover 70 that overlaps with the switch 52 during rotation of the cover 70 about a central axis 86 of the meter 20. In other words, the switch interface surface 80 may include an arcuate surface that curves along a path of rotation of the meter cover 70 during the removal of the meter cover 70 from the meter 20. Accordingly, the switch interface surface 80 may form an arc having an angle 88 that is less than or substantially equal to a degree of rotation suitable for removing the cover 70 from the base portion 72 when the cover 70 is in a fully closed position. For example, the degree of rotation suitable for removing the annular-shaped cover 70 from the base portion 72 from a fully secured position may be between approximately 10° and 50°, with the arc angle 88 being between approximately 1° and 50°, such as between approximately 5° and 45°, 10° and 40°, 15° and 35°, or between approximately 20° and 30°. In one non-limiting example, the degree of rotation for removing the cover 70 from the base portion 72 may be approximately 22°, and the arc angle 88 of the switch interface surface 80 may also be approximately 22°.

Figure 4:
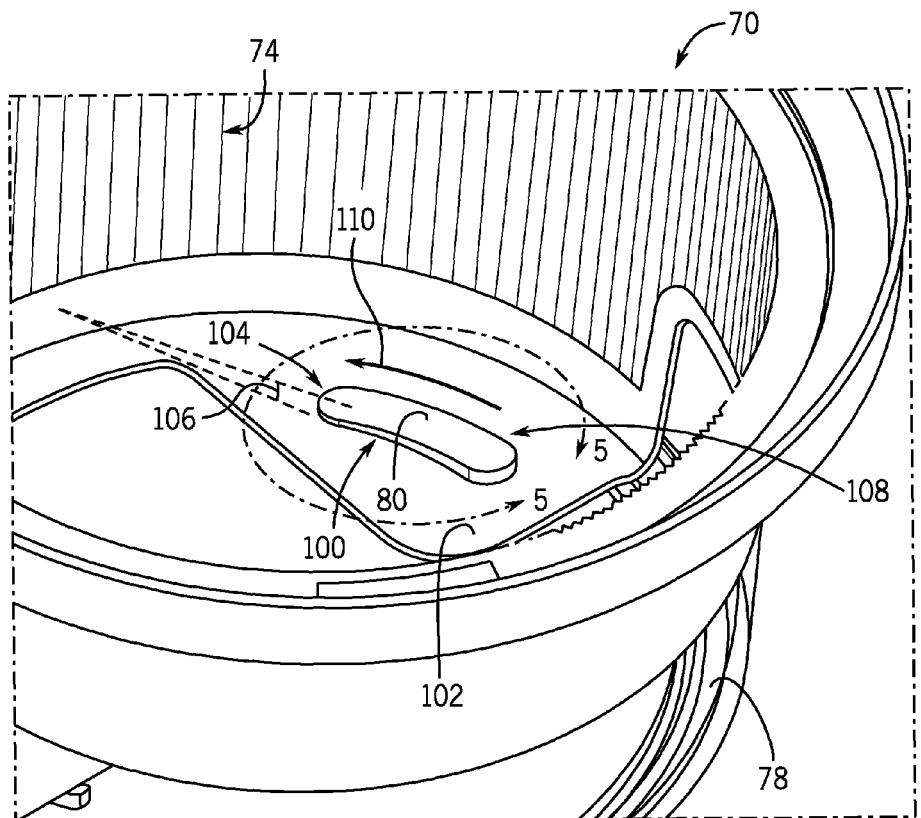
FIG. 4 is a rear perspective view of an internal surface of the meter cover of FIG. 3 and illustrating an embodiment of a switch interface surface configured to contact the tamper detect switch as the cover is rotated.

In accordance with the disclosed embodiments, the switch interface surface 80 may contact the switch 52 along its entire length, or may only contact the switch 52 along a portion of its length. Further, in one embodiment, the switch interface surface 80 is configured such that even when the switch interface surface 80 is disposed over the switch 52, the surface 80 may not provide sufficient force to change the state of the switch 52 until the cover 70 has been rotated by a predetermined amount. FIG. 4 is an expanded view of an inner surface 102 of the cover 70, and depicts an embodiment of the switch interface surface 80. In FIG. 4 the switch interface surface 80 is formed from a tapered protrusion 100 extending away from the inner surface 102 of the front section 78 of the cover 70. Specifically, the tapered protrusion 100 includes a first section 104 that increases in thickness, as determined by a taper angle 106, to a second section 108. The taper angle 106 is generally defined as the angle at which the switch interface surface 80 is oriented with respect to the inner surface 102. By way of non-limiting examples, the taper angle 106 may be between approximately 1° and 70°, 5° and 50°, 10° and 40°, or between approximately 15° and 30°. The taper of the tapered protrusion 100 enables the switch interface surface 80 to provide differential forces to the contact surface 82 of the switch 52. For example, the switch interface surface 80 of the tapered protrusion 100 may be angled relative to a direction of the removal of the meter cover 70 from the meter 20.

Specifically, the tapered protrusion 100 is configured such that when the cover 70 is secured to the base portion 72, the first section 104 is generally disposed over the switch 52. In this arrangement, the switch interface surface 80 does not press against the contact surface 82 of the switch 52 (FIG. 3) to an extent such that the switch 52 is placed into a closed circuit state. However, as the cover 70 is rotated, for example in a direction 110, the second section 108 begins to contact or press the contact surface 82 of the switch 52. As the thicker extent of the tapered protrusion 100 engages the switch 52, the switch 52 is changed from the open circuit or "off" state to the closed circuit or "on" state. This enables the processor 46 to receive the signal indicating that the cover 70 has been removed from the meter 20 (e.g., a detected tamper event). The processor 46 may then record the tamper event and may communicate the event to a utility provider (e.g., power utility 12). In certain embodiments, the switch 52 may be configured such that after the cover 70 has been removed from the meter 20 and no force (e.g., a normal or depressive force) is provided to the switch 52, the switch 52 may return to the open circuit or "off" state.

Figure 2:
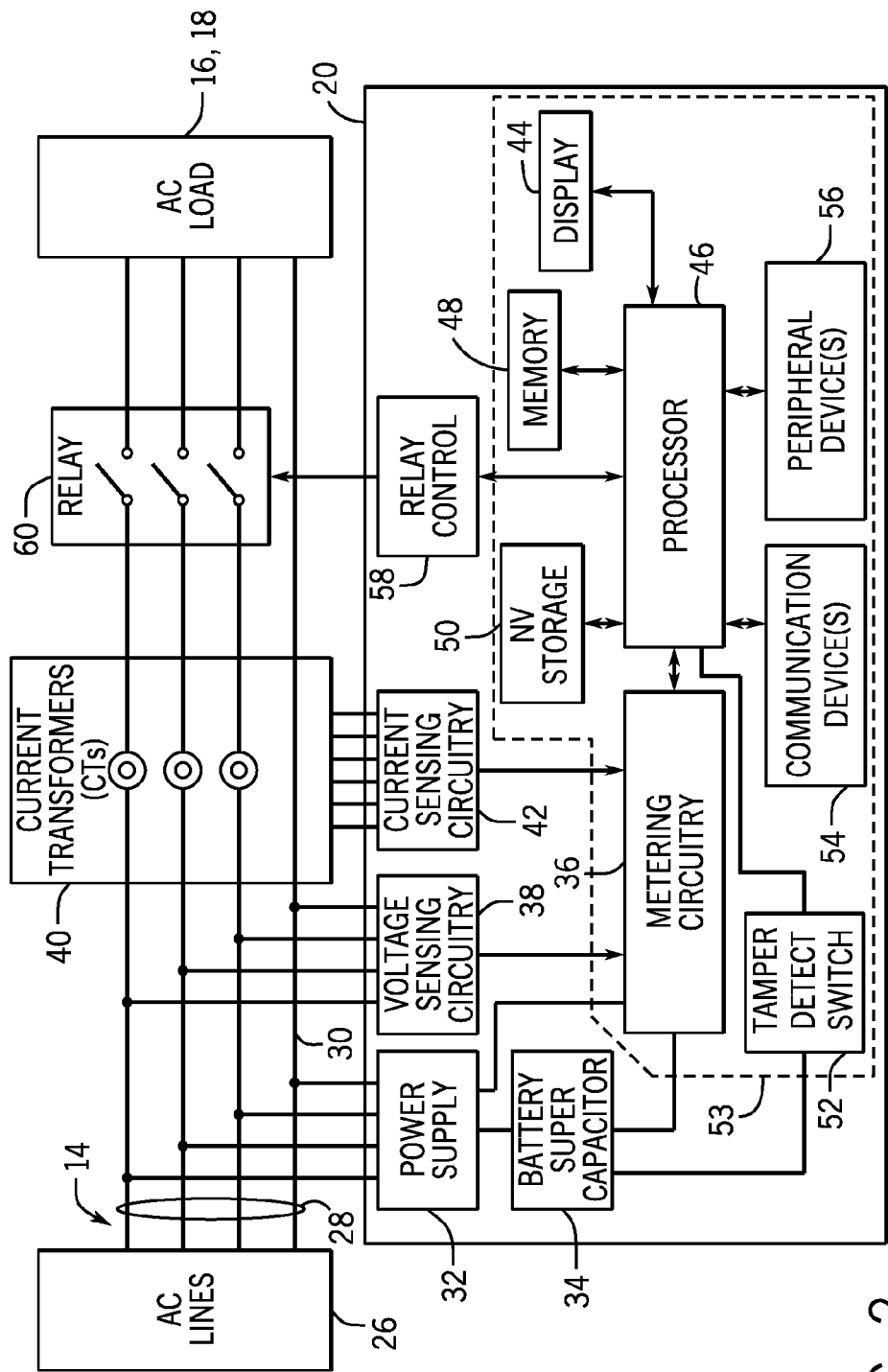
FIG. 2 is a block diagram of an embodiment of such an tamper-detect energy meter.
Figure 5:
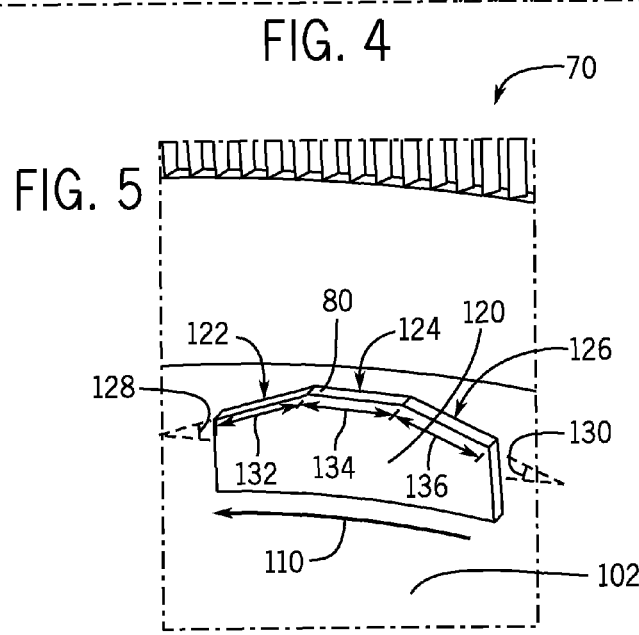
FIG. 5 is an expanded view of section 5-5 of FIG. 4 and illustrating an embodiment of the switch interface surface disposed on the internal surface of the meter cover.

Additionally, as illustrated in FIG. 5, in certain embodiments, the switch interface surface 80 may be formed from a protrusion 120 having more than one taper, such as two or more tapered regions, which may enable at least some control over the timing of the signal provided to the processor 46 (FIG. 2). Specifically, FIG. 5 is an expanded view of the cover 70, taken within section 5-5 and illustrating the protrusion 120 as including a first tapered portion 122, a constant height portion 124, and a second tapered portion 126. In certain embodiments, as discussed below, the first tapered portion 122 and the second tapered portion 126 may be considered to be an upramp and a downramp, respectively, as the cover 70 is rotated in the direction 110. In a general sense, as the cover 70 is rotated in the direction 110, the first tapered portion 122 begins to contact and press the switch 52. Just before or as the constant height portion 124 begins to contact the switch 52, the switch 52 may change from the open circuit state to the closed circuit state. As noted above, this state change may enable a signal, such as an electrical current, to be provided to the processor 46. As the cover 70 continues to rotate in the direction 110 during removal of the cover 70, the second tapered portion 126 contacts the switch 52, and the normal force provided to the switch 52 begins to reduce until the switch 52 returns to the open circuit state. Therefore, the switch 52, during rotation of the cover 70 depicted in FIG. 5, undergoes a change from open to closed to open again. In certain embodiments, this may result in a current pulse being provided to the processor 46, with the timing of the pulse being determined by the geometric relationships between the first tapered portion 122, the constant height portion 124, and the second tapered portion 126.

For example, certain features of the protrusion 120 that may impact the timing of a current pulse provided to the processor 46 via the switch 52 include a rise angle 128 of the first tapered portion 122 with respect to the inner surface 102, a fall angle 130 of the second tapered portion 126 with respect to the inner surface 102, first, second, and third lengths 132, 134, 136 of the first tapered portion 122, the constant height portion 124, and the second tapered portion 126, respectively, or any combination thereof. The rise and fall angles 128, 130 may be the same or different, though it may be desirable for them to be the same for timing purposes. The rise and fall angles 128, 130 may, therefore, be independent of one another and may each have an angle between approximately 1° and 80°, such as between approximately 10 and 70°, 15 and 60°, 20 and 40°, or approximately 25°.

As noted above, the length of the switch interface surface 80, and therefore the length of the protrusion 120, may depend on the amount of rotation suitable for removing the cover 70 from the meter 20. The first, second, and third lengths 132, 134, 136 may have lengths that are the same or different, and may be independent of one another. The second length 134 of the constant height portion 124 may, in certain embodiments, directly determine the duration of the current pulse provided to the processor 46. Because the actual lengths of each may be influenced by the position of the protrusion 120 with respect to the main rotational axis 86 of the meter 20, it may be desirable to express the lengths 132, 134, 136 in terms of degrees of arc (e.g., angular rotation about axis 86). Accordingly, each of the lengths 132, 134, 136 may have a length of between approximately 1° and 20° of arc, 2° and 15° of arc, or 3° and 10° of arc. By way of a non-limiting example, in an embodiment where the arc angle 88 (FIG. 3) is approximately 22°, the first length 132 may be approximately 7° of arc, the second length 134 may be approximately 8° of arc, and the third length 136 may be approximately 7° of arc. However, as noted above, each of these lengths may be independent of one another, and any one or a combination may be increased or decreased to affect the pulse duration of the current pulse. For example, the constant height portion 124 may be increased or reduced to increase or reduce, respectively the duration of the current pulse.

Figure 6:
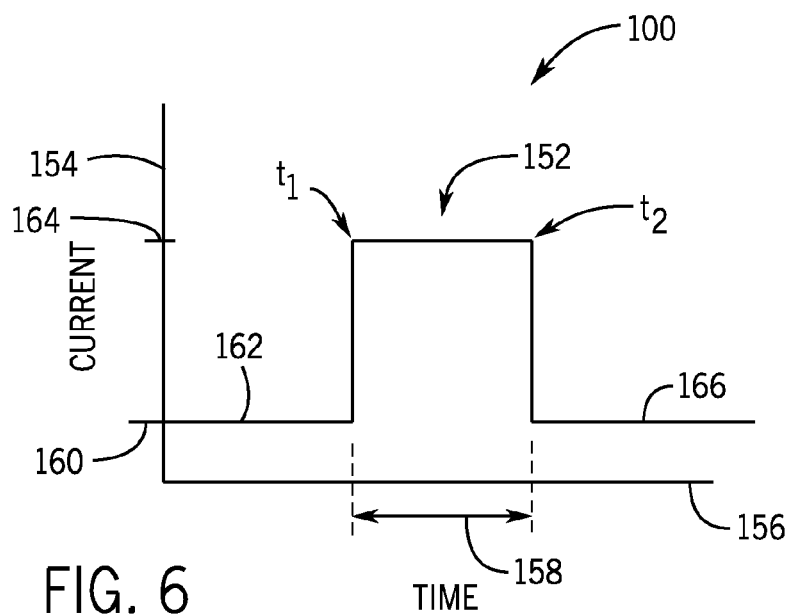
FIG. 6 is a plot of current versus time illustrating an embodiment of a tamper-detect signal being provided to a processor of the energy meter of FIG. 2.

FIG. 6 illustrates an embodiment of a plot 150 of such a current pulse 152 as generated using a protrusion with a similar configuration to protrusion 120 of FIG. 5. Specifically, the plot 150 is representative of the current provided to the processor 46 during a low power state, represented as a base current 154, of the meter 20. For example, it may be desirable for the meter 20 to continue to be able to detect potential tampering situations even when power is not being provided to a consumer (e.g., due to a power outage). In such situations, the meter 20 may not be able to draw power from an external source, such as the AC lines 26 (FIG. 2), and may be powered entirely by the battery/super capacitor 34 (FIG. 2). Accordingly, the meter 20 may be configured to draw power for only essential processes, such as intermittent communications, as well as a suitable amount of power to maintain the data stored within the NV storage 50, the memory 48, and/or the processor 46 (e.g., for refreshing). Indeed, in this low power state, the processor 46 may enter a sleep mode. While in the sleep mode, the processor 46 may perform passive processing steps, such as by responding to signals that temporarily wake the processor 46 to perform a certain function. The current pulse 152 may be one such signal used for tamper detection and reporting, e.g., to the utility provider 12.

The time span illustrated for the plot 150 may be representative of a total amount of time suitable for removing the cover 70 from the base portion 72. For example, the total time of the plot 150 may represent an average amount of time suitable for rotating the cover 70 with respect to the base portion 72. As discussed above, the protrusion 120 contacts the tamper detect switch 52 during this time, and the second length 134 of the constant height portion 124 at least partially determines a width 158 of the current pulse 152. As illustrated, the current 154 is maintained at a base current level 160 during the sleep mode of the meter 20. Specifically, before the constant height portion 124 contacts the switch 52, a minimal current level is drawn by the switch 52. By way of a non-limiting example, the base current level 160 may be between approximately 1 $\mu A$ and 10 $\mu A$, 1 $\mu A$ and 8 $\mu A$, 1.5 $\mu A$ and 6 $\mu A$, or between approximately 2 and 5 $\mu A$. The base current level 160, when in such a range, may be desirable to enable a base operational mode of the meter 20 for an extended period of time. Placing the switch 52 in a usually "off" or open circuit state, rather than a usually "on" or closed circuit state, may be desirable to prolong the life of the meter 20 while the meter 20 is powered by the battery/super capacitor 34. For example, a relatively higher current draw (i.e., greater power usage), such as at a level greater than 50 $\mu A$, may reduce the life of the meter 20 while the meter is powered by the battery/super capacitor 34. Further, an always closed or "on" switch may have a reduced lifespan due to mechanical failure, and the switch may not be as responsive as an always "off" or open switch, such as the switch 52. In other words, the switch 52 remains in a relaxed state to avoid wear on various elements of the switch 52 while the cover 70 is attached to the meter 20.

The plot 150 includes a first current level 162, which represents the substantially constant current draw by the switch 52 before any potential tamper situation (i.e., cover removal) is detected. Once the cover 70 is rotated by an amount such that the constant height portion 124 of the protrusion 120 contacts the switch 52, such as at time $t_1$, the switch 52 is changed to the "on" or closed circuit state. Accordingly, the switch 52 draws a second, higher current level 164, which may be considered the tamper detect signal provided to the processor 46 to wake the processor 46.

Upon waking at time $t_1$, the processor 46 records the potential tampering event (e.g., in NV storage 50 or within a memory of the processor 46). Thus, the width 158, or time span of the current pulse 152, may be correlative with a suitable amount of time for the processor 46 to record the event. By way of a non-limiting example, the width 158 may be between approximately 1 and 5 milliseconds (ms), such as between approximately 1 ms and 4 ms, 1 ms and 3 ms, or between approximately 1 ms and 2 ms. Again, the width 158 may be determined by a number of factors including but not limited to the second length 134 of the constant height portion 124 of the protrusion 120, an amount of rotation suitable for removing the cover 70, the tightness of the cover 70 on the base portion 72, or any combination thereof.

At the end of the current pulse 152 at a second time $t_2$, the switch 52 returns to the "off" or open circuit state. This results in a return to the base current level 160 draw by the switch 52, as depicted by second current level 166, which is substantially the same as the first current level 162. During the second current level 166, the processor 46 may return to the sleep mode.

Figure 7:
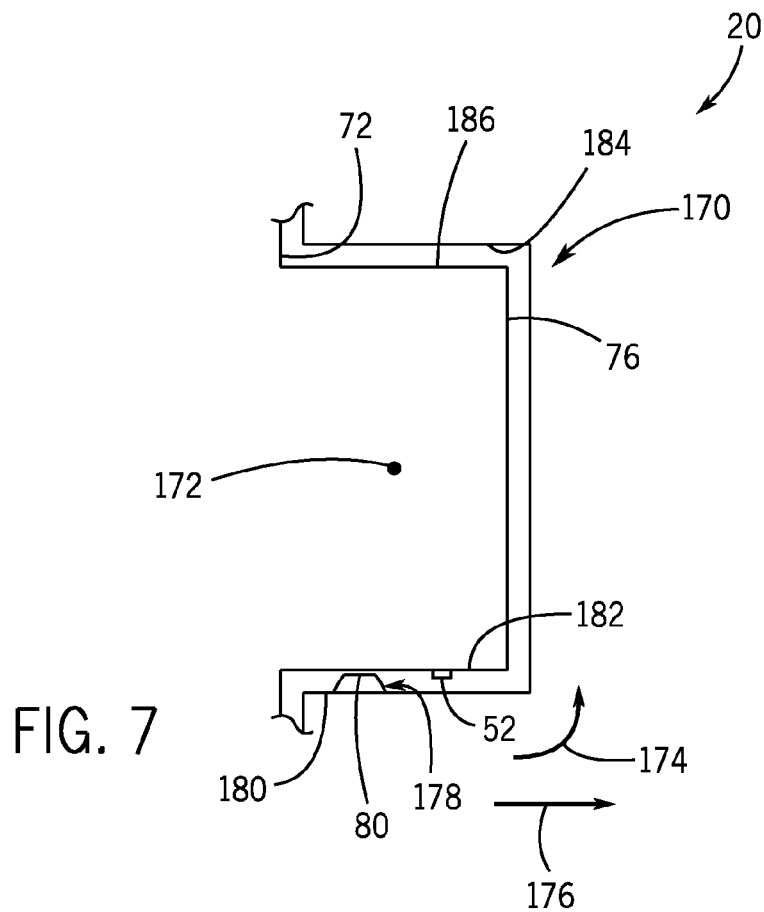
FIG. 7 is a side cross-sectional view of the tamper-detect energy meter of FIG. 2 having a push button switch and a cover configured to change the state of the switch as the cover is rotatably removed or pulled away from the energy meter.

The disclosed embodiments are applicable to any utility meter having a cover. For example, as depicted in the side profile view of an installed meter in FIG. 7, the disclosed embodiments for tamper detection may also be applied to embodiments of the meter 20 having a different coupling mechanism and/or shape. For example, the meter 20 of FIG. 7 may have a non-rotational (e.g., linear) coupling mechanism, a hinged coupling mechanism, etc. Regarding the cover shape, the meter 20 may have a square or rectangular cross-sectional geometry. As illustrated, a polygonal cover 170 may be disposed over the base portion 72 of the meter 20, which may have a corresponding square or rectangular cross-sectional geometry. The polygonal cover 170 may be coupled to the base portion 72 in a manner such that the cover 170 is rotatably removed from the base portion 72 (e.g., via a hinge) by rotation about a crosswise axis of rotation 172. Such a rotational direction is illustrated as a curved arrow 174. Alternatively, the polygonal cover 170 may be removed from the base portion 72 of the meter 20 by pulling the cover 170 away from the base portion 72 in a linear direction generally away from the base 72 (e.g., perpendicular to the base 72), as illustrated by arrow 176.

The polygonal cover 170 also includes the switch interface surface 80 formed by a protrusion 178 on a lower internal surface 180 of the cover 170. Likewise, the meter 20 has an embodiment of the tamper detect switch 52 positioned on a lower portion 182 of the meter 20. In this configuration, as the cover 170 is pulled away from the meter 20 in either or both of directions 174, 176, the switch interface surface 80 contacts the tamper detect switch 52. As a result, the switch 52 changes from the open circuit state to the closed circuit state, and a current pulse (e.g., current pulse 150) is provided to the processor 46 as an indication of a potential tamper situation. The protrusion 178 and switch 52 may, additionally or alternatively, be placed on respective upper surfaces 184, 186 of the cover 170 and meter 20.

While the disclosed embodiments directed toward detecting removal of the meter cover 70, 170 (FIGS. 3, 7) may be integrated into a delivered utility meter, it may be desirable to retrofit an existing utility meter with certain elements that enable tamper detection in accordance with the present disclosure. Accordingly, the disclosed embodiments may also provide a retrofit kit for a utility meter. The retrofit kit may include, but is not limited to, the meter cover 70, 170 (FIGS. 3, 7) having the switch interface surface 80, a protrusion (e.g., protrusion 100 of FIG. 5 and/or protrusion 120 of FIG. 7) configured to attach to an inner surface of an existing meter cover, the tamper detect switch 52 adapted to communicatively couple width processor 46, a communication device (e.g., a communication card) configured to send information relating to tamper events to a utility provider, or any combination thereof. In embodiments where the kit includes a communication device, the communication device may include one or more features for interfacing with a port of the processor 46 (FIG. 2), such as an in/out pin of the processor 46. In certain embodiments, the communication device may, in some embodiments, couple the tamper detect switch 52 to the processor 46. Furthermore, the communication device may include an associated processor for processing information/data including, but not limited to, information/data relating to tamper signals, tamper events, tamper communication, or any combination thereof.

Figure 8:
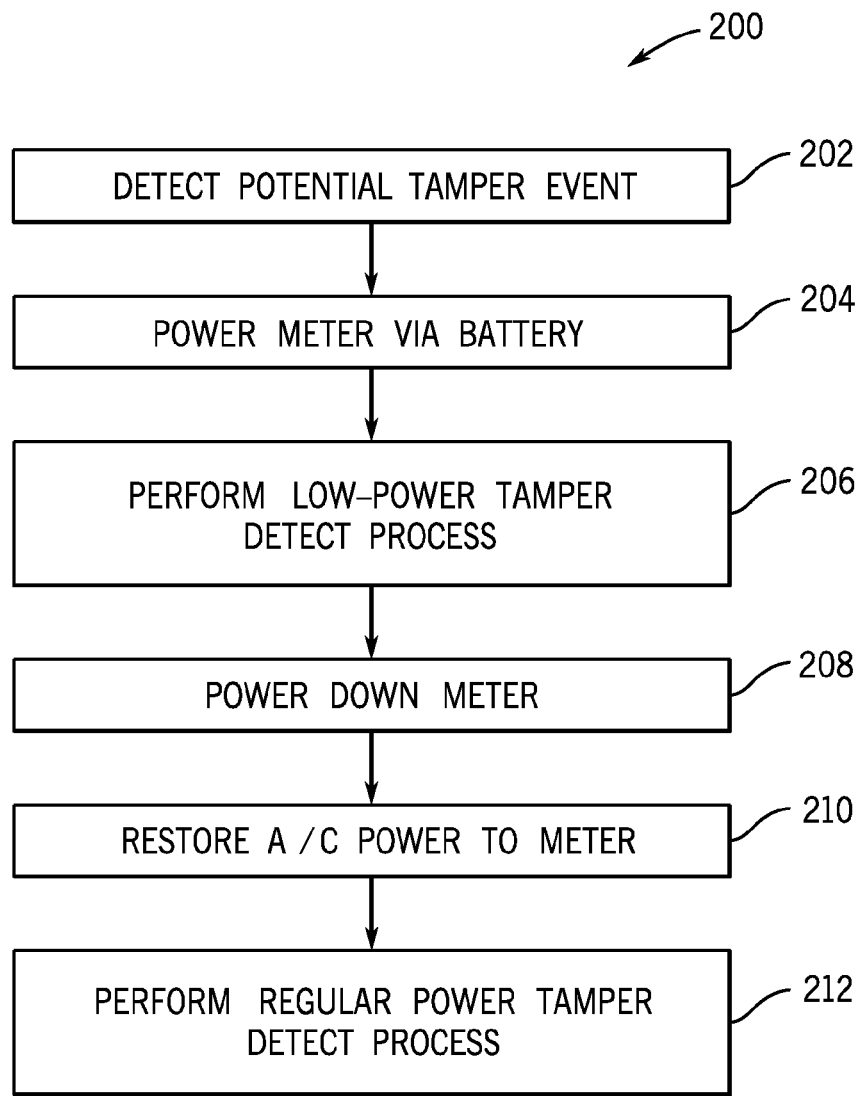
FIG. 8 is a process flow diagram illustrating an embodiment of a method of operation of the tamper-detect energy meter of FIG. 2.

One embodiment of the manner in which the tamper-detect energy meter 20 may operate is illustrated as a process flow diagram in FIG. 8. Specifically, FIG. 8 depicts an embodiment of a method 200 of operation of the tamper-detect energy meter 20 during a low power situation. For example, the meter 20 may perform some or all of the acts represented in FIG. 8 in situations where power has been cut to a consumer (e.g., for non-payment of power services), or in situations of low- or no-power as a result of weather or seismic activity. In such situations, the meter 20 may be in a "sleep"

mode or other low power mode where the meter 20 is powered via an internal energy storage unit, such as the battery/super capacitor 34. The meter 20, therefore, may perform a minimal number of processes to maintain power to the meter 20 for as long as possible. For example, in one embodiment, communications, metering, and so forth, may not typically occur while in the low power state, except during situations where the firmware of the meter 20 instructs the processor 46 to perform certain functions, as described below.

The method 200 may begin with detecting a potential tamper event (block 202). For example, the cover 70 (FIG. 3) of the meter 20 may be rotated so as to trigger the tamper detect switch 52. As noted above, in such a situation, the switch 52 may cause a current pulse or similar signal to be sent to the processor 46, the pulse being indicative of the removal (e.g., of the potential tampering situation). The meter 20 may then wake to a battery-based operational mode, where the meter 20 is powered by the battery/super capacitor 34 (block 204).

As a result of the current pulse being sent to the processor 46 and the meter 20 waking to the state in which it is powered by the battery/super capacitor 34, the meter 20 may then perform a low-power tamper detect process (block 206). The acts represented by block 206 may include, by way of non-limiting examples, recording (e.g., storing) data relating to the cover removal (e.g., a date and/or time of the removal), communicating with the utility provider 12 that a potential tampering situation has occurred, a visual indication of a potential tampering situation, or any combination thereof.

In one embodiment, the processor 46, as a result of receiving the current pulse, may wake and record a date and/or time of the cover removal (i.e., of the potential tampering event) in the processor's memory, in NV storage 50, or in a similar memory unit. The processor 46 may then power down the meter 20 back to the "sleep" or low power state (block 208). In another embodiment, the processor 46, while the meter 20 is in the battery/super capacitor-powered state, may instruct one or more of the communication devices of the meter 20 to communicate with one or more external devices, such as external metering infrastructure, cellular telephones, personal computers, or similar devices, to name a few. Specifically, one or more indications that the meter 20 has detected a potential tampering situation may be communicated to any one or a combination of these devices. The indications may include identifying information for the consumer and/or the meter, or a time and/or date in which the potential tampering occurred, or any combination thereof. Further, in certain situations, the processor 46 may cause the display 44 to provide a brief (e.g., a few seconds) visual indication that a potential tampering situation has been detected.

The meter 20 may remain in the battery/super capacitor-powered mode until the acts above are performed substantially simultaneously to, or after, the information relating to the tampering event has been recorded by the processor 46. Accordingly, after these acts have been performed, the meter 20 may power down (block 208). The meter 20 may remain in the low-power state, where low-level processes may be performed and powered by the battery/super capacitor 34, for weeks, months, or years. This total operational time may be counted by a real-time clock (RTC) (not shown) of the meter 20, and may also be used for tamper detection, as discussed below.

After the meter 20 has been in the base operational or low power mode, the meter 20 may, in certain situations, be re-powered. That is, A/C power may eventually be restored to the meter 20 (block 210). When power is restored to the meter 20, the meter 20 may then perform a regular power tamper detect process (block 212). The process according to block 212 may include reporting the potential tamper activity to the utility 12, or to another external communications device. That is, the meter 20 may communicate the activity to the utility 12, one or more computers, one or more cellular phones or other personal computing devices, after full power is restored to the meter 20. By way of one non-limiting example, the meter 20 may communicate with metering infrastructure via a radio system of the meter 20 to provide indications relating to the potential tampering event.

In certain embodiments, the processor 46, once full power has been restored, may cause the display 44 to provide one or more indications that a potential tampering situation has occurred. The display 44 may be locked into this indication, for example, until a technician or similar authorized person resets the meter 20 to normal operation. By way of a non-limiting example, in one embodiment, the display 44 may indicate "COVER REMOVAL DETECTED," or "TAMPER DETECTED," and, additionally or alternatively, may provide an indication of the date and/or time of the potential tampering event. Further, the meter 20 may prevent any other operation of the meter 20 or use of the metered utility until the tamper indication has been cleared from the meter 20, for example by resetting the meter 20 using an authorized code and/or authorized hardware.

In certain embodiments, the meter 20 may not be powered by an external source for an extended period of time, in which the meter 20 may have an expected operational life. The expected operational life may be based at least on the energy storage capability of the battery/super capacitor 34 and the rate at which the meter 20 may, during normal operation (e.g., without any tampering), consume energy during its low power, or "sleep" mode. During this time, the RTC of the meter 20 may keep the time in operation of the meter 20. However, in situations where potential tampering has occurred, the meter 20 may perform one or more processes that draw relatively large amounts of current compared to the low powered state. Accordingly, the actual time that the meter 20 is powered by the battery/super conductor 34, in situations in which tampering has occurred, may be shorter than the expected time. The meter 20, therefore, may be in a completely unpowered, or "dead" state in which no processes are powered in the meter 20, including the counting function performed by the RTC.

Once power is restored to the meter 20 (e.g., in accordance with block 210), the RTC may continue counting, or may re-start counting, the operational time of the meter 20. In these situations, the time in operation reflected by the RTC may not agree with the expected time of the meter 20. In embodiments where the expected time in operation of the meter 20 is stored locally (e.g., in memory 48 and/or NV storage 50, the RTC, or the processor 46), the meter 20 may compare the time reflected by the RTC to the expected time. In situations where the two do not agree, which is indicative that the meter 20 has performed communication functions, processing functions, storage functions, or any combination thereof during the low power state, the meter 20 may recognize that a potential tampering situation occurred. The meter 20 may then provide one or more indications, locally and/or externally, that a potential tampering situation has occurred. For example, the meter 20 may provide a local indication on display 44, or may send data relating to a potential tampering situation to the utility 12, a consumer's computer or phone, or any combination thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A utility meter, comprising:
   metering circuitry configured to monitor consumption of a utility;
   a tamper detect switch protruding away from the metering circuitry and operable to switch from an open circuit state to a closed circuit state; and
   a meter cover disposed over at least a portion of the metering circuitry, wherein the meter cover comprises a switch interface surface disposed on a surface of the meter cover facing the metering circuitry, wherein the switch interface surface protrudes toward the metering circuitry such that the tamper detect switch physically contacts the switch interface surface during removal of the meter cover from the utility meter to cause the switch to change from the open circuit state to the closed circuit state;
   wherein the utility meter is configured to generate a signal indicative of the meter cover removal when the switch changes from the open circuit state to the closed circuit state.

2. The utility meter of claim 1, wherein the switch comprises a push button, and the switch interface surface is configured to depress the push button to change the switch from the open circuit state to the closed circuit state during removal of the meter cover.

3. The utility meter of claim 2, wherein the switch interface surface comprises a taper configured to depress the push button gradually as the meter cover is removed from the utility meter.

4. The utility meter of claim 1, wherein the switch comprises a tactile switch, a snap switch, a magnetic switch, a toggle switch, an optical switch, or a combination thereof.

5. The utility meter of claim 1, wherein the switch is configured to change from the open circuit state to the closed circuit state and back to the open circuit state during removal of the meter cover.

6. The utility meter of claim 5, comprising an energy storage unit configured to provide electrical energy to a processor of the utility meter to maintain a base operational mode of the processor when the utility meter is not receiving power from an external source, wherein the processor is configured to control at least a portion of the metering circuitry, and the switch is configured to cause the energy storage unit to send the electrical pulse to the processor as the switch changes from the open circuit state to the closed circuit state and back to the open circuit state.

7. The utility meter of claim 6, wherein a time in which the switch is in the closed circuit state corresponds to a width of the electrical pulse, and the electrical pulse comprises a current level that is at least approximately 2 times greater than a substantially continuous current draw from the energy storage unit by the processor during the base operational mode.

8. The utility meter of claim 1, comprising a communications module communicatively coupled to a processor, wherein the communications module is configured to enable communication between the utility meter and a utility provider, and the processor is configured to provide an indication to the utility provider that the utility meter has been tampered with after receiving the signal indicative of the meter cover removal.

9. The utility meter of claim 1, comprising a memory unit configured to store data relating to the removal of the meter cover, wherein the data is representative of a date of the removal, a time of the removal, or a combination thereof, and the processor is configured to record the data in the memory unit after removal of the meter cover.

10. The utility meter of claim 1, comprising:
    a main meter assembly (MMA) circuit board configured to support at least a processor configured to control the operation of at least a portion of the metering circuitry; and
    a faceplate disposed over utility meter elements mounted to the MMA circuit board, wherein the faceplate is disposed between the MMA circuit board and the meter cover when the utility meter is fully assembled;
    wherein the tamper detect switch is mounted to the MMA circuit board.

11. The utility meter of claim 1, comprising a display operable to provide visual indications relating to information about the utility meter, the consumed utility, or a combination thereof, and wherein a processor is configured to cause the display to provide a visual indication relating to the removal of the meter cover after removal of the meter cover from the utility meter.

12. The utility meter of claim 1, wherein the utility meter comprises an electricity meter, a water meter, a heat meter, a gas meter, or any combination thereof.

13. A retrofit kit for a utility meter, the retrofit kit comprising:
    a switch movable between an open circuit state and a closed circuit state, wherein the switch is configured to interface with metering circuitry of the utility meter and to trigger a signal indicative of a tamper event in the closed circuit state; and
    a meter cover configured to cover at least a portion of the utility meter, wherein the meter cover comprises a switch interface surface disposed on a surface of the meter cover that faces the metering circuitry of the utility meter when the meter cover is placed on the utility meter, wherein the switch interface surface protrudes from the surface and toward the metering circuitry such that the switch interface surface physically contacts the switch during removal of the meter cover from the utility meter to change the switch from the open circuit state to the closed circuit state.

14. The retrofit kit of claim 13, wherein the switch interface surface comprises an arcuate surface that curves along a path of rotation of the meter cover during the removal of the meter cover from the utility meter.

15. The retrofit kit of claim 13, wherein the switch comprises a push button and the switch interface surface comprises a tapered surface, and the tapered surface is angled relative to a direction of the removal of the meter cover from the utility meter.

16. A method, comprising:
    monitoring energy consumption of a utility with metering circuitry of a utility meter;
    controlling an operational parameter of the metering circuitry using a processor of the utility meter; and
    during removal of a meter cover of the utility meter, actuating a switch coupled to and protruding away from the metering circuitry using a switch interface surface that is disposed on a surface of the meter cover facing the metering circuitry, wherein the actuation of the switch causes an electrical pulse to be provided to the processor, wherein the electrical pulse is indicative of removal of the meter cover, and wherein actuating the switch comprises physically depressing the switch.

17. The method of claim 16, comprising storing data relating to the removal of the meter cover using the processor, or a memory, or a combination thereof, and wherein the data comprises a date of the removal of the meter cover, a time of the removal of the meter cover, or a combination thereof.

18. The method of claim 17, comprising sending an alert of a potential tamper event to a utility provider after storing the data.

19. The method of claim 16, comprising displaying information relating to the removal of the meter cover on a display, wherein the information comprises a tamper event indicator, a date of the removal of the meter cover, a time of the removal of the meter cover, or any combination thereof.

20. The method of claim 16, wherein actuating the switch comprises physically depressing the switch to change the switch from an open circuit state to a closed circuit state, wherein in the closed circuit state the switch causes an energy storage unit of the utility meter to provide the electrical pulse, and the electrical pulse comprises a current level that is at least approximately 2 times greater than a substantially continuous current draw from the energy storage unit by the processor during a base operational mode.

* * * * *